United States Patent
Tamura et al.

(10) Patent No.: US 12,061,123 B2
(45) Date of Patent: Aug. 13, 2024

(54) SEMICONDUCTOR DEVICE AND TRIMMING METHOD OF THE SAME

(71) Applicant: RENESAS ELECTRONICS CORPORATION, Tokyo (JP)

(72) Inventors: Shin Tamura, Tokyo (JP); Shinji Kawashima, Tokyo (JP); Hisao Kobashi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 335 days.

(21) Appl. No.: 17/531,248

(22) Filed: Nov. 19, 2021

(65) Prior Publication Data

US 2023/0160754 A1   May 25, 2023

(51) Int. Cl.
| | |
|---|---|
| G01K 1/20 | (2006.01) |
| G01K 1/16 | (2006.01) |
| G01K 7/01 | (2006.01) |
| H01L 21/66 | (2006.01) |
| H03M 1/12 | (2006.01) |

(52) U.S. Cl.
CPC .............. G01K 1/20 (2013.01); G01K 1/16 (2013.01); G01K 7/01 (2013.01); H01L 22/30 (2013.01); *H01L 22/12* (2013.01); *H01L 22/34* (2013.01); *H03M 1/12* (2013.01)

(58) Field of Classification Search
CPC ... G01K 1/20; G01K 1/16; G01K 7/01; H01L 22/30; H01L 22/12; H01L 22/34; H01L 21/66; H03M 1/12
See application file for complete search history.

(56) References Cited

U.S. PATENT DOCUMENTS

| | | | | |
|---|---|---|---|---|
| 10,515,890 | B2* | 12/2019 | Sato | H01L 23/642 |
| 11,435,237 | B2* | 9/2022 | Chou | G01K 7/20 |
| 11,538,738 | B1* | 12/2022 | Tuncer | H01L 23/49562 |
| 2005/0218470 | A1* | 10/2005 | Ohkubo | G01K 7/01 |
| | | | | 374/E7.042 |
| 2007/0009240 | A1* | 1/2007 | Miyake | H01L 21/67248 |
| | | | | 392/416 |
| 2013/0071958 | A1* | 3/2013 | Kawano | H01L 24/13 |
| | | | | 257/E21.531 |
| 2017/0315001 | A1* | 11/2017 | Ikeda | G01K 15/005 |
| 2018/0066998 | A1* | 3/2018 | Merrikh | G01K 1/14 |
| 2018/0335658 | A1* | 11/2018 | Fujikawa | G02F 1/136286 |
| 2019/0219453 | A1* | 7/2019 | Matsumoto | G01K 7/183 |
| 2021/0255239 | A1* | 8/2021 | Yoshida | G01R 31/2875 |
| 2021/0318175 | A1* | 10/2021 | Chou | G01K 7/01 |

* cited by examiner

*Primary Examiner* — Tran M. Tran
*Assistant Examiner* — Philip L Cotey
(74) *Attorney, Agent, or Firm* — Rimon P.C.

(57) ABSTRACT

A semiconductor device includes a semiconductor substrate on which a temperature sensor is formed, a plurality of insulating films formed above the semiconductor substrate, a temperature measurement wiring pattern formed on a first insulating film which is one of the plurality of the insulating films, a detection electrode which is formed on the uppermost insulating film of the plurality of the insulating films to be arranged at a position corresponding to the first temperature measurement wiring pattern and is provided for contact a temperature measurement needle, and one or more via electrodes formed in one or more insulating film between the temperature measurement electrode and the detection electrode to couple between the temperature measurement electrode and the detection electrode.

8 Claims, 9 Drawing Sheets

SEMICONDUCTOR DEVICE AND TRIMMING METHOD OF THE SAME

BACKGROUND

The present disclosure relates to a semiconductor device and a trimming method of the semiconductor device having a temperature sensor circuit.

A semiconductor device having a temperature sensor module is disclosed in U.S. Patent Application Publication No. 2017/315001, for example. U.S. Patent Application Publication No. 2017/315001 discloses a semiconductor device capable of measuring temperature and power supply voltage with high accuracy.

SUMMARY

Recently, a severe condition for the accuracy of the temperature sensor incorporated in the semiconductor device (error tolerance) is required. In addition, the self-heating due to the high functionality of the semiconductor device (increase in power consumption) affects the yield of the semiconductor device. For example, the self-heating of the semiconductor device cause to rise the temperature to be detected by the temperature sensor in the semiconductor device, so that the temperature of the semiconductor device may be higher than the measurement environment temperature. The detection result of the temperature sensor is affected by manufacturing variations of the device. In order to correct variations in the detection results due to manufacturing variations, the temperature sensor is tested. The output of the temperature sensor is corrected based on the temperature of test measurement environment and the detection result of the temperature sensor under test measurement environment. However, when there is a difference between the temperature of the test measurement environment and an actual temperature of the semiconductor device, it is difficult to appropriately correct variations of the output of the temperature sensor.

The self-heating of the semiconductor device also affects the adjacent semiconductor device. Therefore, the difference between the actual temperature of the semiconductor device and the temperature of measurement environment is different for each semiconductor device.

The output of the temperature sensor is to be corrected appropriately even if the semiconductor device is self-heated.

Other objects and novel features will become apparent from the description of this specification and the accompanying drawings.

An outline of representative ones of the present disclosure will be briefly described below.

According to an embodiment, a semiconductor device includes a semiconductor substrate on which a temperature sensor is formed, a plurality of insulating films formed above the semiconductor substrate, a temperature measurement wiring pattern formed on a first insulating film which is one of the plurality of insulating films, a detection electrode which is formed on the uppermost insulating film of the plurality of insulating films to be arranged at a position corresponding to the first temperature measurement wiring pattern and is provided for contact a temperature measurement needle, and one or more via electrodes formed in one or more insulating film between the temperature measurement electrode and the detection electrode to couple between the temperature measurement electrode and the detection electrode.

In another embodiment, a trimming method includes contacting the detection electrode with the temperature measurement needle, measuring a temperature in vicinity of the temperature sensor through the detection electrode after supplying a power to the semiconductor device, acquiring a code output by the temperature sensor, trimming a code to be output as an internal temperature of the semiconductor device based on the measured temperature through the detection electrode and the acquired code.

According to the semiconductor device of the above embodiment, the temperature sensor can be appropriately corrected by actually measuring the internal temperature of the semiconductor device and using the measured internal temperature as a reference.

DETAILED DESCRIPTION

Figure 1:
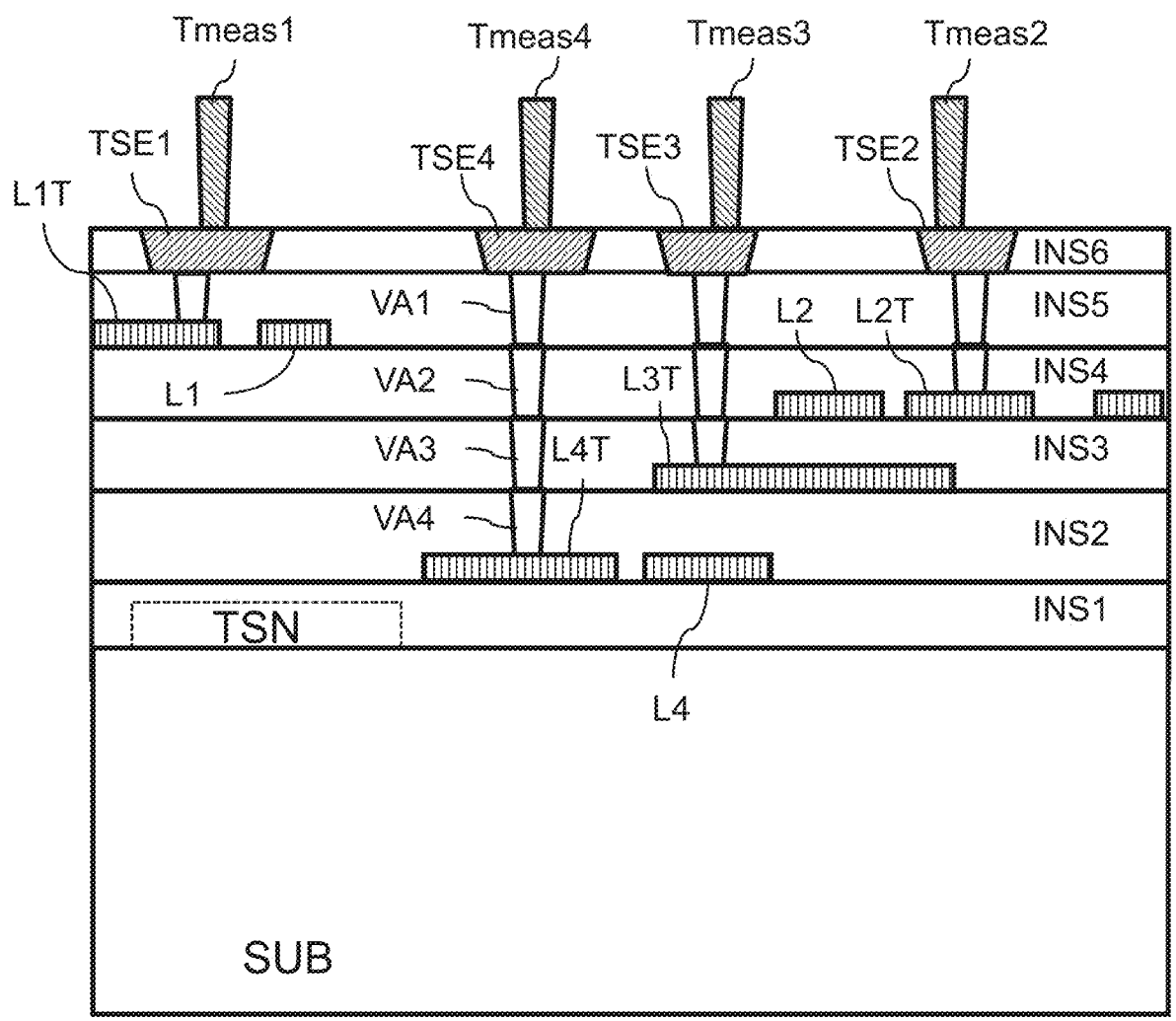
FIG. 1 is a conceptual diagram showing probe needles for temperature measurement and a cross-sectional view of the semiconductor device according to the first embodiment.

Hereinafter, Embodiment(s) will be described with reference to the drawings. However, in the following description, the same components are denoted by the same reference numerals, and a repetitive description thereof may be omitted. It should be noted that the drawings may be represented schematically in comparison with actual embodiments for the sake of clarity of explanation, but are merely an example and do not limit the interpretation of the present disclosure.

Figure 2:
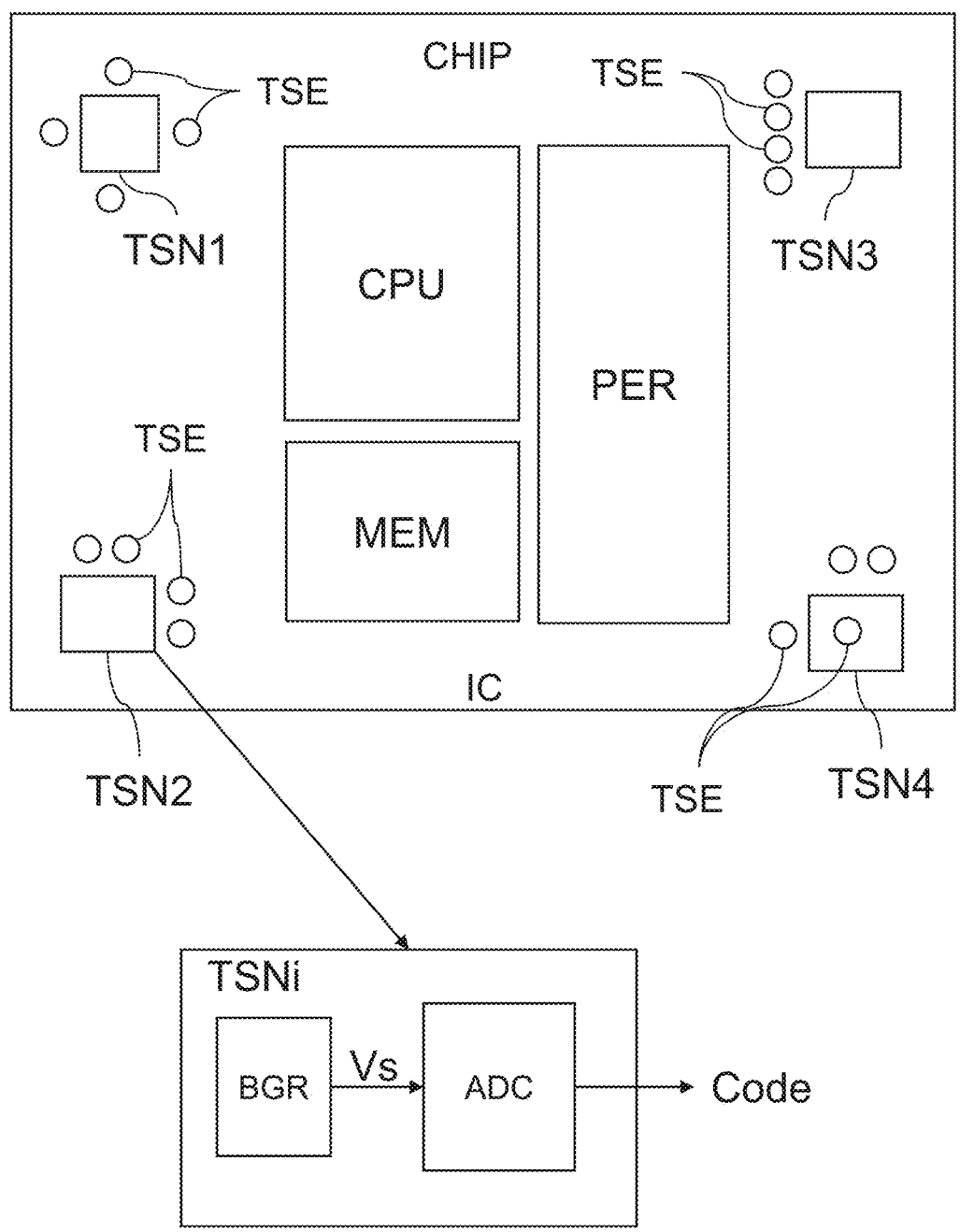
FIG. 2 is a conceptual plane view of the semiconductor device according to the first embodiment.
Figure 3:
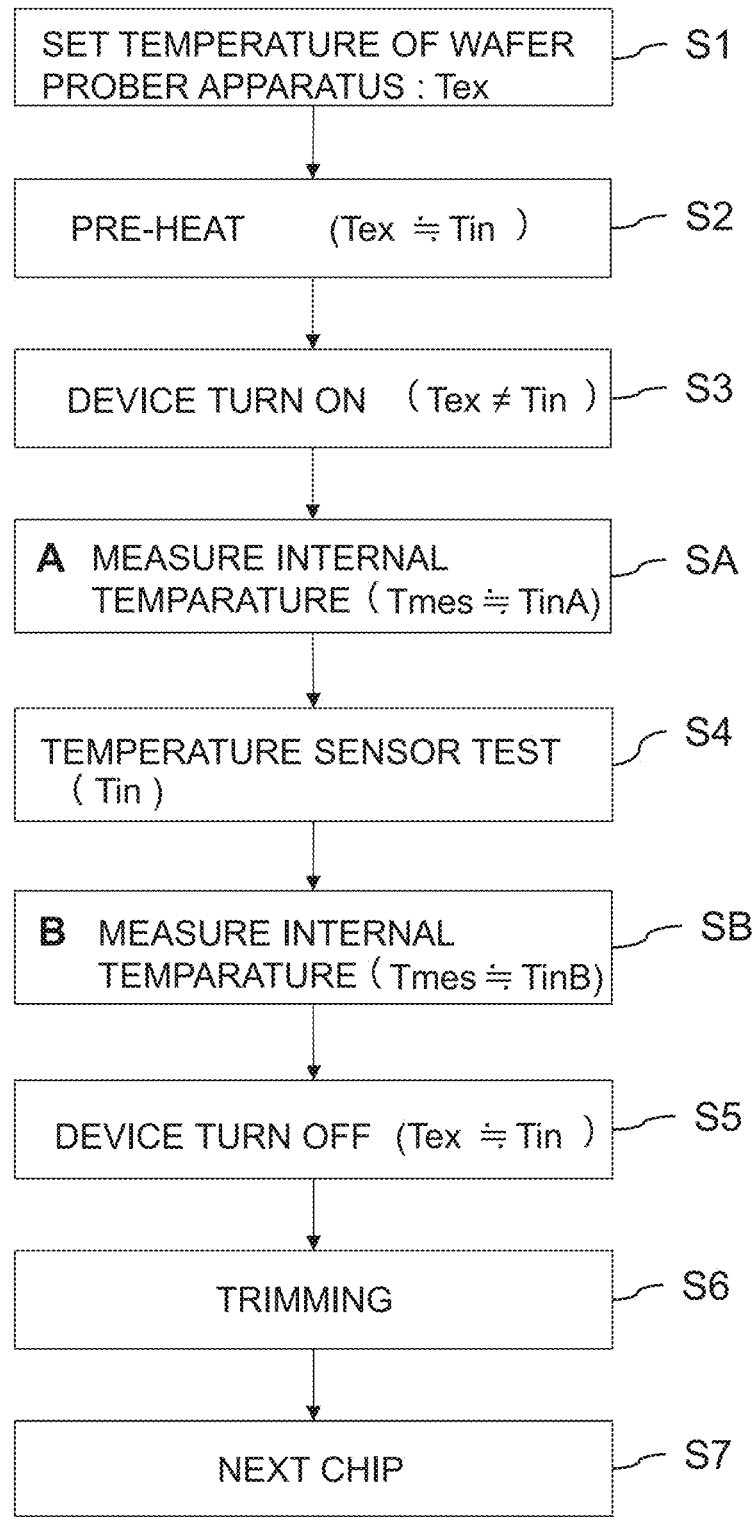
FIG. 3 is a process flow diagram showing the trimming method of the temperature sensor according to the first embodiment.
Figure 4:
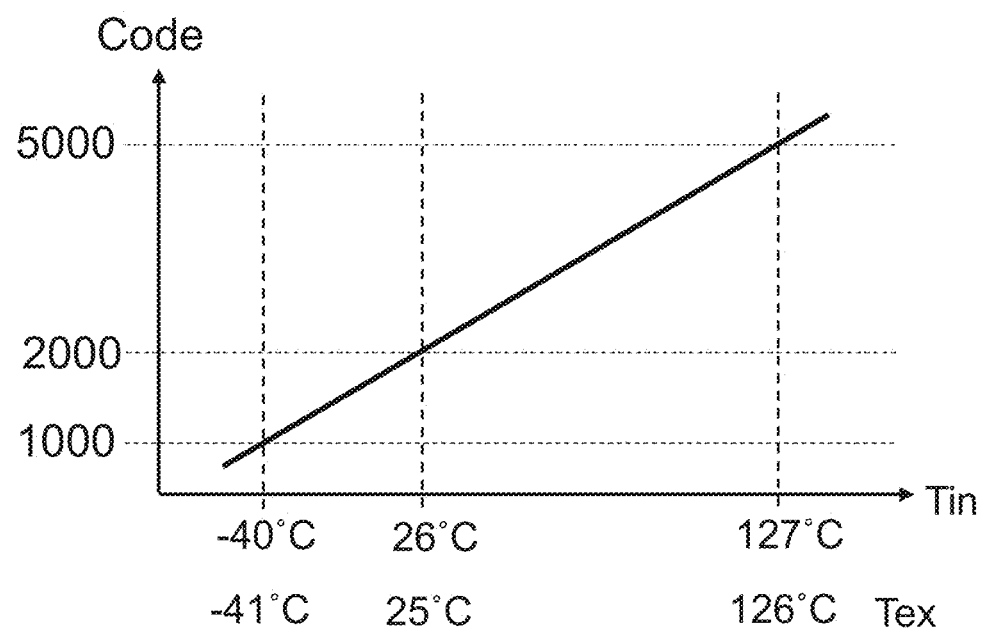
FIG. 4 is a diagram illustrating a trimming method.

FIG. 1 is a conceptual diagram showing probe needles for temperature measurement and a cross-sectional view of the semiconductor device according to the first embodiment. FIG. 2 is a conceptual plane view of the semiconductor device according to the first embodiment. FIG. 3 is a process flow diagram showing the trimming method of the temperature sensor according to the first embodiment. FIG. 4 is a diagram illustrating a trimming method.

In the development and manufacturing process of semiconductor device, wafer prober apparatus is used in the electrical inspection of semiconductor wafers. In electrical inspection, test signals are given to individual devices (semiconductor chips) on the semiconductor wafer from a measuring instrument or a tester through a probe needle or a probe card to acquire response signals from the device. For example, the wafer prober apparatus is used to transport semiconductor wafers and to contact probe needles or probe cards at predetermined position on individual devices on the semiconductor wafer.

For example, when the output of the temperature sensor in the semiconductor device is corrected based on the set temperature of the wafer prober apparatus (hereinafter, "Tex"), it is preferable to make a state that the internal temperature of the semiconductor device (hereinafter "Tin") is equal to Tex in the test of the temperature sensor. To achieve this, we have considered measures to prevent self-heating in the test process such as a test flow with pre-heating. The pre-heating is performed at the beginning of the entire test. On the basis of Tex and the output results of the temperature sensor under such a test environment, trimming for correction of the output of the temperature sensor is performed. In this way, the output variation of the temperature sensor is adjusted to achieve high accuracy.

However, the self-heating of the device may cause a difference between Tex and Tin. Further, in the semiconductor device having a plurality of temperature sensors, each temperature sensor is affected from (power consumption of) the peripheral circuit. A temperature difference occurs even inside one semiconductor device, and the temperature sensors in the same semiconductor device detect respective different temperature. In this state, assuming Tin≈Tex, when performing the trimming of the temperature sensor, the accuracy of the temperature detection of the temperature sensor is lowered. Further, originally, despite a temperature sensor that detects the internal temperature appropriately, since the output result is out of the trimmable range, it may be determined as defective as not satisfy the required accuracy of the temperature sensor. That is, there is a possibility that the yield is lowered.

Therefore, in the first embodiment, as shown in FIG. 1, providing temperature detection electrodes TSE1, TSE2, TSE3, TSE4 exposed to the device surface. The temperature detection electrodes TSE1 to TSE4 are formed in the same layer as the bonding electrode. The temperature detection electrodes TSE1, TSE2, TSE3, TSE4 are connected to the wiring patterns L1T, L2T, L3T, L4T which are formed in the different wiring layers through the respective one or more metal via electrodes VA1, VA2, VA3, VA4. Thus, the respective temperatures of the different wiring patterns L1T, L2T, L3T, L4T, it is possible to directly monitor via the temperature measurement needles Tmeas1, Tmeas2, Tmeas3, Tmeas4 which are physically contacted to the temperature detection electrodes TSE1, TSE2, TSE3, TSE4. The temperature measurement needles Tmeas1, Tmeas2, Tmeas3, Tmeas4 are provided on the probe needle or probe card of the wafer prober apparatus. Incidentally, the wiring patterns L1T, L2T, L3T, L4T are not electrically connected to the internal circuits of the semiconductor device. In other words, the wiring patterns L1T, L2T, L3T, L4T can be referred to as temperature measurement wiring patterns which are exclusively arranged for measuring the internal temperature Tin.

The temperature directly monitored by the temperature measurement needles Tmeas1, Tmeas2, Tmeas3, Tmeas4 is defined as the internal temperature of the semiconductor device (Tin). Accordingly, the trimming of the temperature sensor can be performed by using the directly monitored internal temperature Tin which is directly monitored by the temperature measurement needles T, not by using the set temperature (Tex) of the wafer prober apparatus. This makes it possible to reduce the error due to the temperature discrepancy (deviation) between Tex and Tin.

The via electrodes VA1, VA2, VA3, VA4, for example, may be a metal electrode such as aluminum (Al). The thermal conductivity of aluminum (Al) is 240 w/m·k, and it is possible to measure temperature with about 200 times accuracy than the thermal conductivity 1.4 w/m·k of silicon oxide is an insulating film. Metals such as aluminum are suitable as materials for the via electrodes VA1, VA2, VA3, VA4.

In FIG. 1, for example, the surface portion of the semiconductor substrate SUB composed of silicon single crystal, a plurality of semiconductor elements including the temperature sensor (temperature sensor circuit) TSN are formed. The temperature sensor TSN includes circuits such as a bandgap reference circuit BGR and an analog-to-digital conversion circuit ADC.

On the upper side of the surface portion of the semiconductor substrate SUB, for example, a plurality of insulating films INS1, INS2, INS3, INS4, INS5, INS6 composed of a silicon oxide film or the like are laminated in this order. The wiring patterns L4, L4T are formed on the upper side of the first insulating film INS1, the via electrode VA4 is formed by embedding in a through hole formed in the second insulating film INS2. The wiring pattern L3T are formed on the upper side of the insulating film INS2, the via electrode VA3 is formed by embedding in a through hole formed in the third insulating film INS3. The wiring pattern L2, L2T are formed on the upper side of the insulating film INS3, the via electrode VA2 is formed by embedding in a through hole formed in the fourth insulating film INS4. The wiring pattern L1, L1T are formed on the upper side of the insulating film INS4, the via electrode VA1 is formed by embedding in the through hole formed in the fifth insulating film INS5. Each of the temperature detection electrodes TSE1, TSE2, TSE3, TSE4 is connected to the via electrode VA1, each of the temperature detection electrodes TSE1, TSE2, TSE3, TSE4 is formed by embedding in a through hole formed in the sixth insulating film INS6. In the present embodiment, the sixth insulating film INS6 can also be referred to as the uppermost insulating film.

Thus, as shown in FIG. 1, the temperature measurement needle Tmeas1 contacts with the wiring pattern L1T via the via electrode VA1. The temperature measurement needle Tmeas2 contacts with the wiring pattern L2T via the via electrodes VA1, VA2. The temperature measurement needle Tmeas3 contacts with the wiring pattern L3T via the via electrodes VA1, VA2, VA3. The temperature measurement needle Tmeas4 contacts the wiring pattern L4T with via the via electrodes VA1, VA2, VA3, VA4.

In FIG. 1, the temperature detection electrode TSE1 and the wiring pattern L1T are connected at the shortest distance via the via electrode VA1. Similarly, the temperature detection electrode TSE2 and the wiring pattern L2T is connected at the shortest distance via the via electrodes VA1, VA2, the temperature detection electrode TSE3 and the wiring pattern L3T is connected at the shortest distance via the via electrodes VA1, VA2, VA3, the temperature detection electrode TSE4 and the wiring pattern L4T is connected at the shortest distance via the via electrodes VA1, VA2, VA3, VA4. That is, in plane view as viewed from above, the via electrode VA1 connected to the wiring pattern L1T is provided directly below the temperature detection electrode TSE1. Similarly, the via electrodes VA1, VA2 between the wiring pattern L2T and the temperature detection electrode TSE2 are provided directly below the temperature detection electrode TSE2. The via electrodes VA1, VA2, VA3 between the wiring pattern L3T and the temperature detection electrode TSE3 is provided directly below the temperature detection electrode TSE3. The via electrodes VA1, VA2, VA3, VA4 between the wiring pattern L4T is provided directly below the temperature detection electrode TSE4. As a result, accurate temperatures of the wiring patterns L1T, L2T, L3T, and L4T can be measured through the temperature measurement needles Tmeas1, Tmeas2, Tmeas3 and Tmeas4.

Incidentally, the via electrodes VA1, VA2, VA3, VA4 and the wiring patterns L1T, L2T, L3T, L4T are not via electrodes and wiring layers provided newly for temperature measurement. The via electrodes VA1, VA2, VA3, VA4 and wiring layers for the wiring patterns L1T, L2T, L3T, L4T are also used as via electrodes and wiring layers for forming the central processing unit CPU, memory MEM, peripheral circuit PER (see FIG. 2) in the semiconductor device. That is, the configuration shown in FIG. 1 can be realized without the addition of a new manufacturing process.

FIG. 2 is a plan view showing a conceptual layout configuration of semiconductor device ICs having a plurality of temperature sensors TSN to TSN4, central processing units CPUs, memory devices MEMs, and peripheral circuits PERs. Further, in FIG. 2, the circuit configuration of the temperature sensor TSNi (i=1 to 4) is shown. The temperature sensor TSNi includes a is bandgap reference circuit BGR for outputting a voltage Vs depending on the temperature, the voltage Vs receives the voltage Vs, and an analog-to-digital converter ADC for receiving the voltage Vs and converting the voltage Vs into the code signal Code as a digital signal indicating the temperature.

The semiconductor device IC is a rectangular semiconductor chip CHIP. In this example, a plurality of temperature sensors TSN1 to TSN4 are respectively disposed in the vicinity of the four corners of the semiconductor chip CHIP.

As shown in FIG. 2, around the forming area of the temperature sensor TSN1, four temperature detection electrodes TSE are arranged. Here, the four temperature detection electrodes TSE corresponds to the temperature detection electrodes TSE1, TSE2, TSE3, TSE4 of FIG. 1. In lower layers of the temperature detection electrodes TSE1, TSE2, TSE3, TSE4, as described in FIG. 1, the via electrodes VA1, VA2, VA3, VA4 and the wiring patterns L1T, L2T, L3T, L4T are provided.

In the two surrounding areas of the forming area of the temperature sensor TSN2, four temperature detection electrodes TSEs (TSE1, TSE2, TSE3, TSE4) are arranged two by two. Around the forming area of the temperature sensor TSN3, four temperature detection electrodes TSE (TSE1, TSE2, TSE3, TSE4) are arranged collectively. As in the temperature sensors TSN1 to TSN3, by placing the temperature detection electrodes TSE in the surrounding area of the formation area of the temperature sensor TSN, it is possible to accurately measure the internal temperature Tin in the vicinity of the forming area of the temperature sensors TSN1 to TSN3.

At least one of the four temperature detection electrodes TSE (TSE1, TSE2, TSE3, TSE4) may be arranged on the forming area of the temperature sensor such as temperature detection electrode for the temperature sensor TSN4. For example, one temperature detection electrode TSE may be arranged in the vicinity (or upper side) of the output circuit for outputting voltage Vs of the bandgap reference circuit BGR of the temperature sensor TSN4. Thus, it may be configured to be able to accurately measure the internal temperature Tin in the vicinity of the output circuit of the bandgap reference circuit BGR. The other three temperature detection electrodes TSE may be arranged in two surrounding areas of the forming area of the temperature sensor TSN4. For example, the lowermost wiring pattern L4T connected to the temperature detection electrode TSE4 of FIG. 1 may be arranged in the vicinity (or the upper) of the output circuit of the bandgap reference circuit BGR. The wiring patterns L1T, L2T, L3T connected with the temperature detection electrodes TSE1, TSE2, TSE3 of FIG. 1 respectively, may be arranged in two surrounding areas of the formation area of the temperature sensor TSN4. The wiring patterns L1T, L2T, L3T, as compared with the wiring pattern L4T, can be said to be a wiring pattern provided on the upper layer.

Next, a trimming method of the temperature sensor according to the first embodiment will be described with reference to FIG. 3.

Step S1) Set the set temperature of the wafer prober apparatus. The set temperature at this time is referred to as an external temperature Tex.

Step S2 (pre-heat)): The probe card is warmed up for a certain period of time to align the chuck temperature and device temperature conditions (Tex≈Tin).

Step S3) The power voltage is supplied to the device. As a result, the semiconductor chip, which is a device, generates heat (Tex is no longer equal to Tin).

Step SA) By the configuration described in FIG. 1, the internal temperature (TinA) of the device is measured via the temperature measurement needle Tmeas (measurement temperature by Tmes=TinA). There is no particular problem when the four internal temperatures Tin measured by the temperature measurement needle Tmeas1, Tmeas2, Tmeas3, Tmeas4 of FIG. 1 are the same. However, when the four measured internal temperatures Tin are different each other, the calculated value by calculating the average of the four internal temperatures Tin or by calculating the weighted average may be the internal temperature TinA.

Step S4) The test of the temperature sensor circuit TSN is tested at the above temperature. In this test, the code from the analog-to-digital conversion circuit ADC in the temperature sensor circuit TSN is acquired.

Step SB) After the measurement of S4, the internal temperature (TinB) of the device is measured again via the temperature measurement needle Tmeas for temperature measurement (measurement temperature by Tmes=TinB). There is no particular problem if the four internal temperatures Tin measured by the temperature measurement needle Tmeas1, Tmeas2, Tmeas3, Tmeas4 of FIG. 1 are the same. However, when the four internal temperatures Tin measured by the temperature measurement needles are different each other, the calculated value by calculating the average of the four internal temperatures Tin or by calculating the weighted average may be the internal temperature TinB. Then, the internal temperature Tin is calculated based on the internal temperature TinA and TinB at the time of measurement (or calculated). There are no particular problems if TinA and TinB are the same. However, if TinA and TinB are different each other, for example, the averaged value of TinA and TinB may be the final internal temperature Tin.

Step S5) The power voltage to the device is stopped. Heat generation of semiconductor chip, which is device, stops.

Step S6) Based on the final internal temperature Tin calculated in step SB, trimming process of the output code of the temperature sensor TSN is performed.

Step S7) If there are a plurality of devices in the wafer is that have not yet been trimmed, the process returns to step S1 to execute the processing flow. Once the temperature sensor circuit TSN of all devices in the wafer has been tested, the process flow is terminated.

The output code of the temperature sensor circuit TSN, in the above-described procedure, may be trimmed by three times test of the temperature sensor circuit at the external temperature Tex set to −41° C., room temperature (e.g., 25° C.), and 126° C.

In the trimming method described above, the internal temperature Tin of the device is measured in step SA and step SB, but step SB may be omitted.

An example of a method for trimming the code of the temperature sensor TSN will be described with reference to FIG. 4. In the example of FIG. 4, three times tests are performed with the external temperature Tex set at −41° C., room temperature (e.g., 25° C.) and 126° C. By the tests, the internal temperatures Tin measured via the temperature measurement needle indicates −40° C. at Tex=−41° C., 26° C. at Tex=25° C. and Tex=126° C. At this time, the code of the output of the temperature sensor TSN is, for example, THCODE_L at an internal temperature Tin of −40° C., THCODE_T at an internal temperature Tin of 26° C., and THCODE_H at an internal temperature Tin of 127° C. Here, data indicating the correspondence relationship between the internal temperature Tin and the output code of the temperature sensor TSN is stored in the memory device MEM provided in the semiconductor device IC. The output of the temperature sensor may be trimmed by using the stored data. For example, the offset of the output of the temperature sensor may be adjusted based on the stored data. Preferably, a non-volatile storage device, such as an electric fuse (eFuse) in the semiconductor device IC, may store data indicating a correspondence between the output code of the internal temperature Tin and the temperature sensor TSN.

According to the first embodiment, the device internal temperature Tin in the vicinity of the temperature sensor TSN is actually measured before the semiconductor device is mounted on the printed board. Then, the output code of the temperature sensor TSN are trimmed based on the internal temperature Tin actually measured. Thus, it is possible to trim the temperature sensor TSN appropriately, and to improve the accuracy of the temperature sensor TSN.

Further, the temperature sensor can correctly evaluate whether it detects the temperature appropriately or whether it can be trimmed. Thus, it is possible to prevent the yield deterioration due to being determined to be defective despite the originally good product.

Second Embodiment

Figure 5:
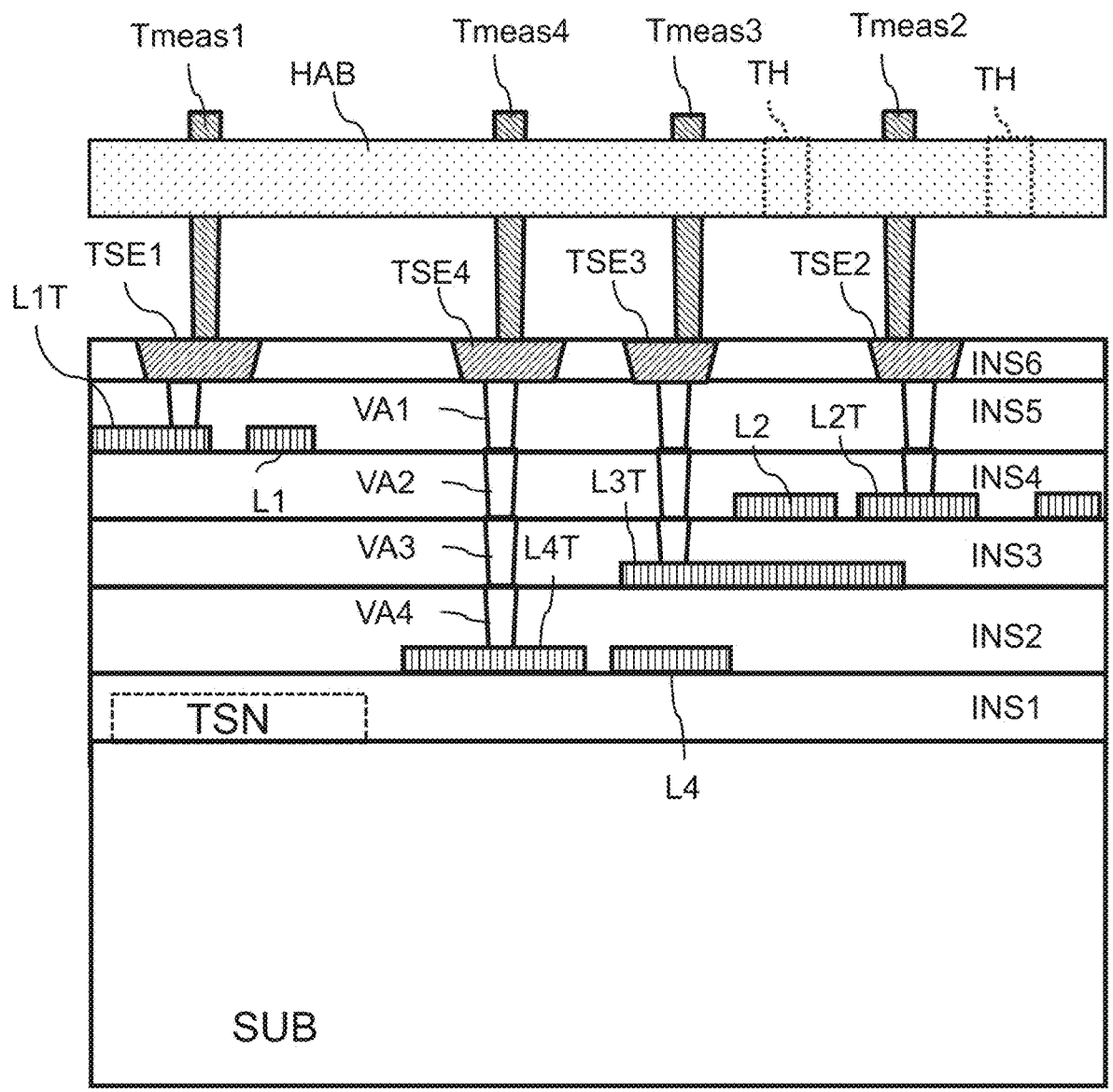
FIG. 5 is a conceptual diagram showing a case where a heat absorbing block is provided on the needle for temperature measurement according to the second embodiment.
Figure 6:
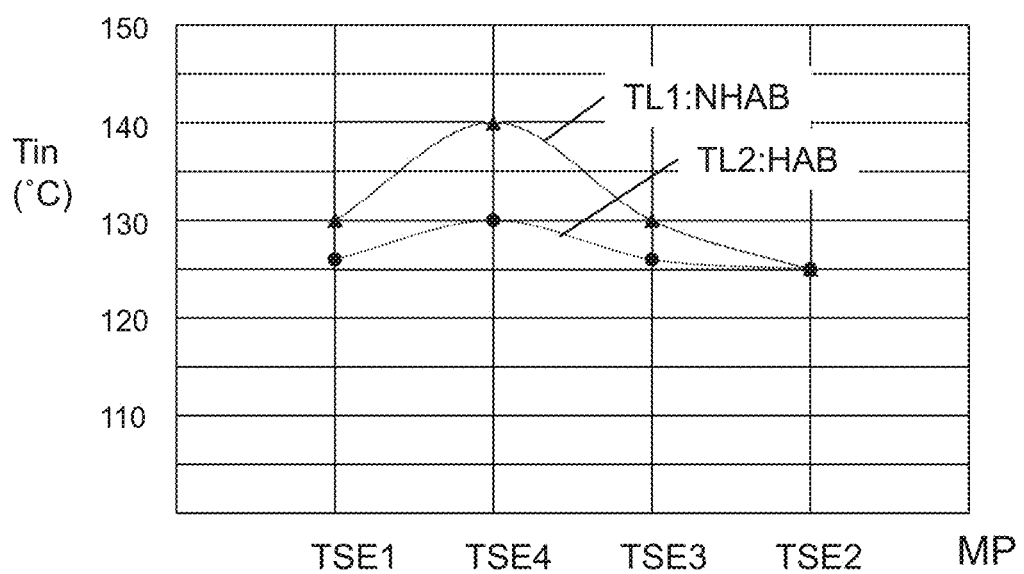
FIG. 6 is a diagram illustrating a temperature gradient image and a temperature gradient suppression image in the device.

FIG. 5 is a conceptual diagram showing a case where the heat absorbing block HAB is provided on the needle for the temperature measurement according to the second embodiment. FIG. 6 is a is diagram illustrating a temperature gradient image and a temperature gradient suppression image in the device.

In the first embodiment, when mounting a plurality of temperature sensors TSN1 to TSN4 in the same semiconductor device, each temperature sensor is affected from the peripheral circuits (for example, effect of power consumption of the peripheral circuits). The temperature difference of inside of the semiconductor device occurs, thus, each of the temperature sensors TSN1 to TSN4 may detect respective different internal temperature Tin even in the same device.

In the present embodiment, a method of making the temperature of the entire inside of the chip uniform is disclosed. As shown in FIG. 5, in the probe needle and the probe card of the wafer prober apparatus, heat absorbing blocks HABs are provided on the needle or on base sides of the temperature measurement needle Tmeas1, Tmeas2, Tmeas3, Tmeas4. By providing the heat absorption block HAB, the heat generated inside the device is absorbed by the heat absorption block HAB to radiate heat, thereby realizing uniform temperature in the device. The heat absorbing block HAB may be provided with a through hole TH through which a probe needle for measuring a signal passes.

In the graph of FIG. 6, the vertical axis represents the internal temperature Tin (° C.), the horizontal axis represents the temperature measuring point MP (TSE1 to TSE4: see FIG. 1). In FIG. 6, the line TL1 indicates the temperature gradient at the temperature measuring point MP when the heat absorbing block HAB is not provided (NHAB). Line TL2 shows the temperature gradient at the temperature measuring points when the heat absorbing block HAB are provided. Thus, by providing the heat absorbing block HAB, it is possible to equalize the temperature gradient of the internal temperature Tin in the device. The configuration of the heat absorbing block HAB is provided for each temperature measurement needle Tmeas1 to Tmeas4 of the temperature sensor TSN1 to TSN4 of FIG. 2. Thus, it is possible to uniformize by suppressing the temperature gradient of the internal temperatures Tin of each temperature sensor TSN1 to TSN4 in the same device.

By equalizing the internal temperatures Tin in the device, the internal temperatures Tin of each temperature sensor TSN1 to TSN4 can be substantially the same.

This eliminates the need to acquire codes for each temperature sensor TSN1 to TSN4 eliminating the need for complex calculations within the temperature trimming program. As a result, it is expected that the efficiency of the program coding and the shortening of the test time are realized.

Further, the temperature in the device becomes uniform, it is possible to more accurately grasp whether the code value when actually measured at a number of times, it is possible to eliminate the distribution deviation due to the temperature difference inside the device. Further, in the probe card, the is free space reserved for avoiding the thermal influence of the adjacent chip is not necessary, and the effect of the compact design of the probe card, e.g., inexpensive and increase of the number of measurements at the same time, is expected.

Third Embodiment

Figure 7:
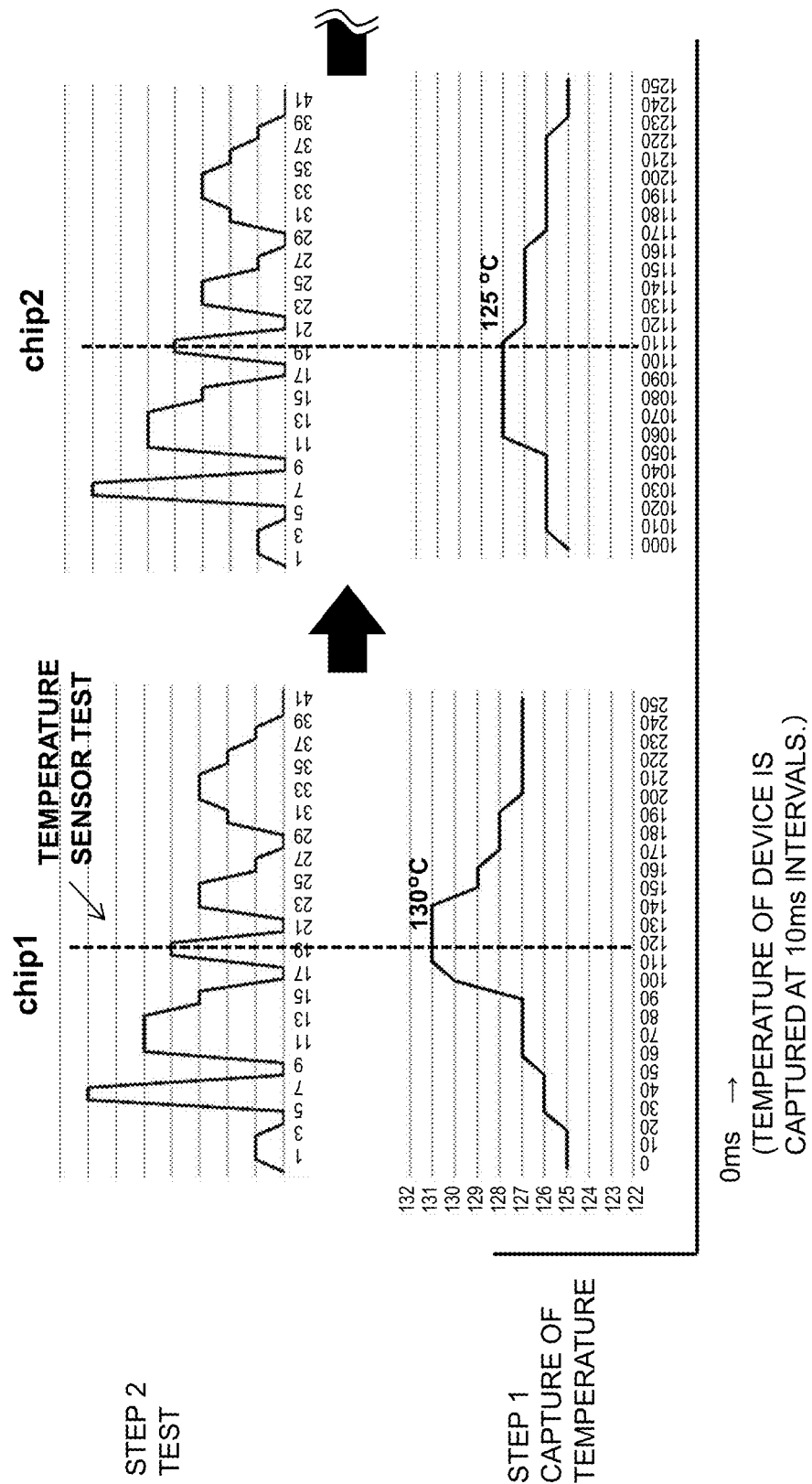
FIG. 7 is a diagram showing a trimming method of the temperature sensor according to the third embodiment.
Figure 7:
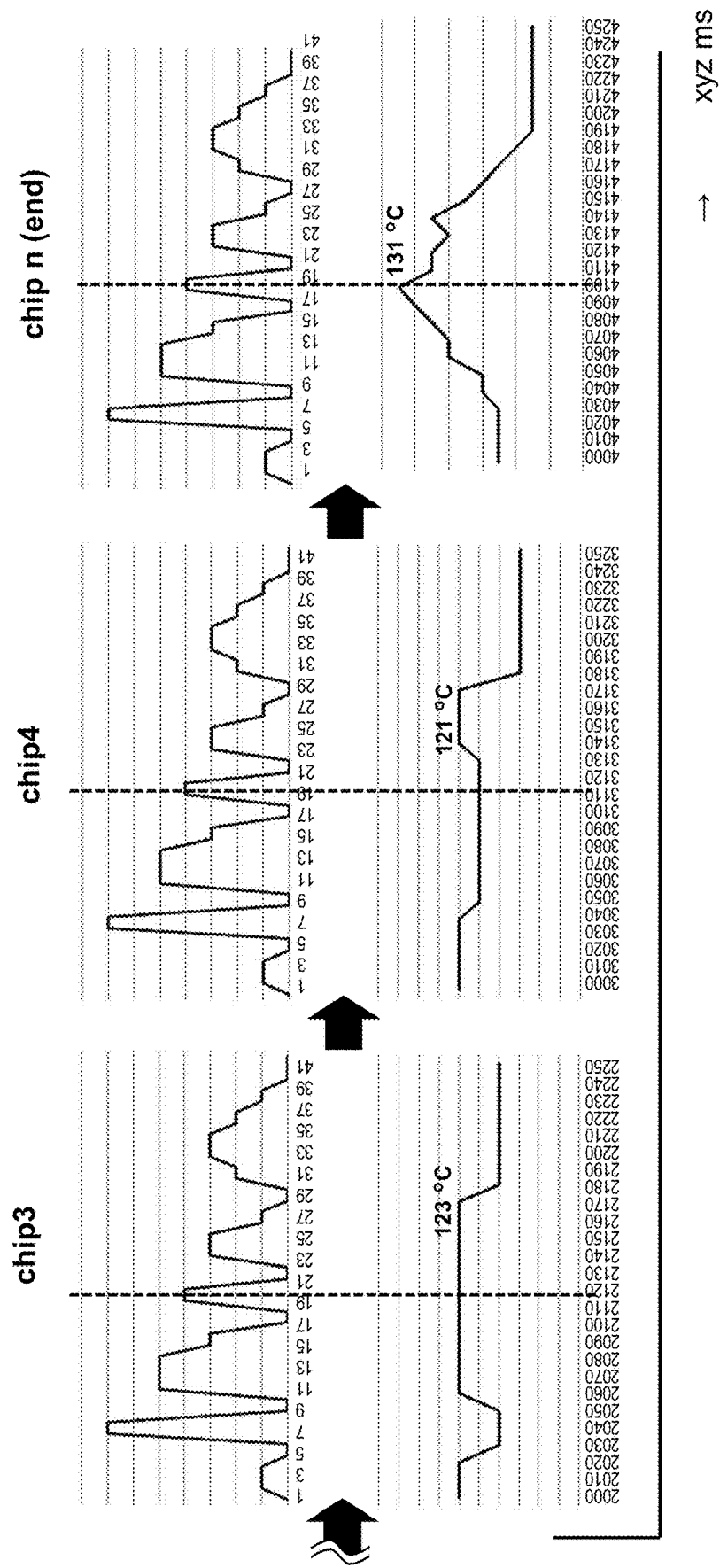

The third embodiment will be described with reference to FIG. 7. FIG. 7 is a diagram showing a trimming method of the temperature sensor according to the third embodiment.

In FIG. 7, the internal temperature Tin of the device, which is measured through the temperature detection electrode and the temperature measurement needle as the first embodiment, is captured at a predetermined intervals and stored in the server in parallel with the normal test. That is, as shown in Step1 of FIG. 7, the internal temperatures of the devices to be tested (chip1-chipn) in the semiconductor wafer are captured at 10 msec intervals from the start of the test. The captured internal temperatures of the devices to be tested (chip1-chipn) are stored in the server. As shown as an Step2 of FIG. 7, a normal test (including a temperature sensor test) is performed on the device to be tested (chip1-chipn) in the semiconductor wafer. Here, Step1 and Step2 are performed in parallel.

Since Step2 can calculate the time from the test start to the temperature sensor test, Step1 and Step2 make it clear the internal temperature Tin of each chip when performing the temperature sensor test.

Although the tests of the devices chip1 to chipn is performed separately, the internal temperature Tin of the device is accurately known when the temperature sensor test of the respective devices is performed. Thus, the code of the temperature sensor TSN in each device is trimmed with reference to the captured internal temperature Tin. Even if there is a difference in the internal temperature Tin between the devices, if the internal temperature Tin of the individual devices is accurately known, it is possible to accurately trim the code of the temperature sensor.

That is, in the third embodiment, by capturing and storing the internal temperature Tin of the device at the predetermined intervals in parallel with the normal test, the internal temperature Tin of each test item of the devices can be confirmed. After completion of the test, the internal temperatures Tin at the test of the temperature sensor of all devices can be acquired based on the time from the test start to the test of the temperature sensor TSN. Thus, it is possible to perform separately trimming process of the code of the temperature sensor based on captured internal temperature Tin at the test of the temperature sensor of each device. Accordingly, the program for trimming the temperature becomes complicated calculation is not necessary, it can be expected to improve the efficiency of the program coding and the yield of the semiconductor chip.

Fourth Embodiment

Figure 8:
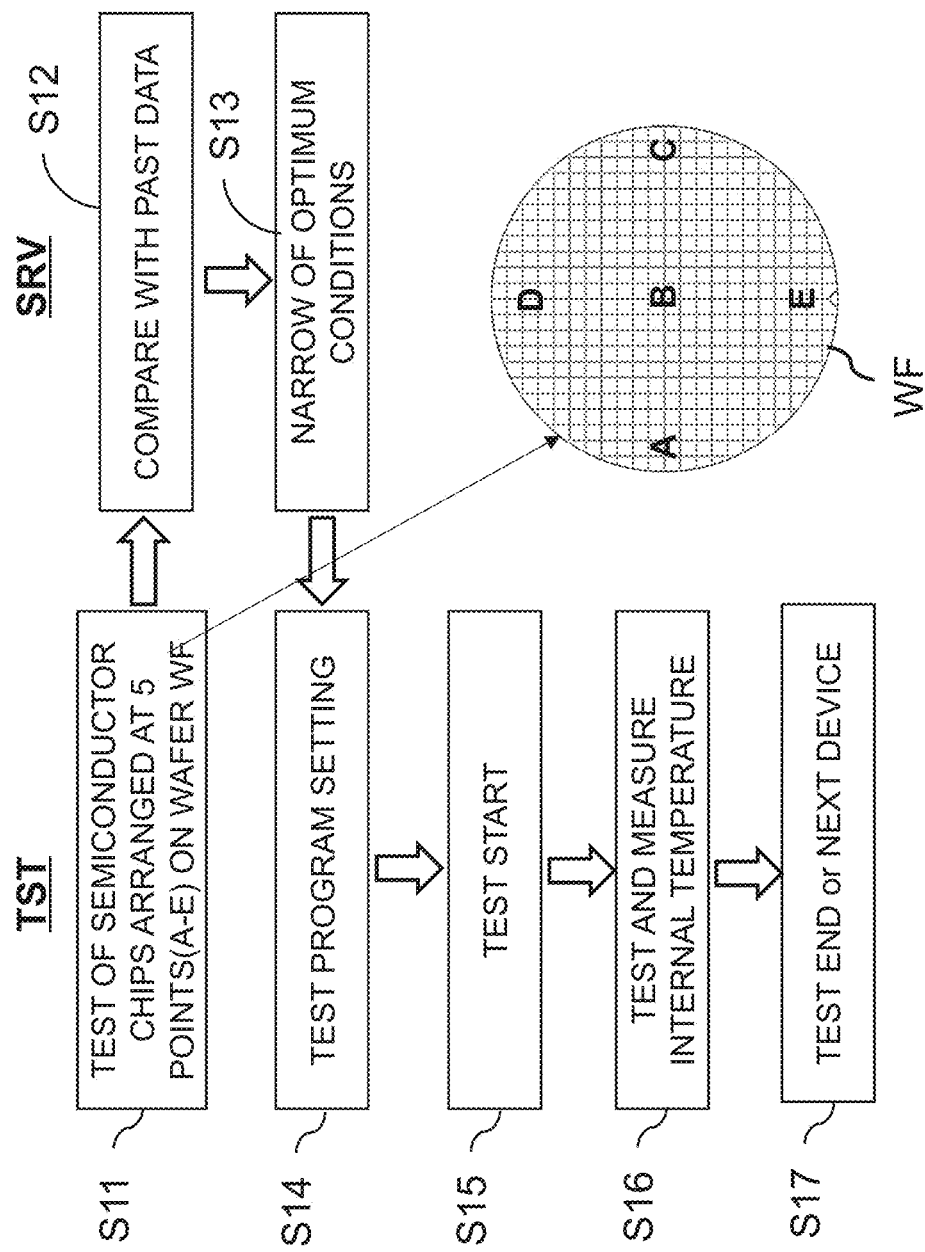
FIG. 8 is a processing flow diagram showing a trimming method of the temperature sensor according to the fourth embodiment.

As an application example of the third embodiment, a trimming method will be described in which, after an accurate internal temperature Tin is acquired, all data of the internal temperature Tin is stored in a server, and trimming of a temperature sensor circuit incorporated in a semiconductor device is performed by using data stored in the server. FIG. 8 is a processing flow diagram showing a trimming method of the temperature sensor circuit according to the fourth embodiment. Hereinafter, the processing flow diagram of FIG. 8 will be described. Steps S11, S14 to S17 are processes performed by the tester TST, and steps S12 and S13 are processes performed by the server SRV.

Step S11: A plurality of areas on the semiconductor wafer WF to be measured, for example, five semiconductor devices (chips) arranged at five points (A, B, C, D, E) are performed the test described in FIG. 7. That is, as described in the third embodiment, the internal temperatures Tin of the five semiconductor devices are acquired at the predetermined intervals in parallel with the normal test. The acquired information is transferred to the server SRV and stored in the server SRV. Thus, the internal temperature Tin for each test item of the five semiconductor devices can be confirmed.

Step S12 (compare with past data): In the server SRV, the internal temperature Tin for each test item of the five semiconductor devices acquired in step S11 are compared with the measured data information of the internal temperature Tin for is each test item of the same product of the semiconductor device executed in the past Step S13 (narrowing of the optimum conditions): The wafer test environment and the Tin value that fluctuates in the wafer plane are estimated by using the information of the wafer stored in the past in the server with the highest correlation with the information tested (temperature measurement) on the semiconductor chip corresponding to multiple areas (A-E). Then, the optimum test conditions for each test item is set based on the estimated value of the internal temperature Tin.

Step S14 (test program setting): The tester TST reflects the optimum test conditions obtained in step S13 to the configuration information of the temperature distribution estimation test program in the plane of the semiconductor wafer WF to be measured.

Step S15 (test start): The tester TST executes the test program obtained in step S14 to start the test of the semiconductor wafer WF to be measured.

Step S16 (execution of each test and measurement of temperature): The test is performed under appropriate conditions in consideration of heat generation by each test item. At the same time, temperature measurement is performed at all times. It is checked there is no difference between the test temperature for which the test conditions were determined and the actual temperature conditions. If there is difference between test conditions or dependent on the test temperature, the test is performed again. When there is no difference between the test temperature and the actual temperature conditions for which the test conditions were determined, the trimming of the temperature sensor TSN in each chip of the semiconductor wafer WF to be measured is performed based on the measurement data information of the internal temperature Tin in the past.

Step S17 (test end and the next device): When the test of all devices of the semiconductor wafer WF to be measured is completed, the test ends. If the test of all devices of the semiconductor wafer WF to be measured has not been completed, the test of the next device (next chip) is performed.

Thus, the test of the semiconductor chip corresponding to the plurality of areas (A to E) in the plane of the measurement target wafer WF is performed, and the result is compared with the past wafer measurement data of the server SRV. The wafer test environment and the Tin value that fluctuates in the wafer plane are estimated by using the information of the wafer stored in the past in the server with the highest correlation with the information tested (temperature measurement) on the semiconductor chip corresponding to multiple areas (A-E). The optimum test conditions for each test item is set based on the estimated value of the internal temperature Tin. The DUTs (semiconductor chips) other than DUTs (semiconductor chips corresponding to multiple areas (A to E)) measured at the start of the test are also constantly measured in temperature to compare the estimated and measured values. As a result, since appropriate test points can be set in each test item, it is possible to prevent yield reduction of the semiconductor device due to improved quality and overkill.

While the invention made by the present inventor has been specifically described above based on the Embodiment, the present invention is not limited to the above-described embodiment and Embodiment, and it is needless to say that the present invention can be variously modified.

What is claimed is:
1. A semiconductor device comprising:
  a semiconductor substrate on which a temperature sensor circuit is formed;
  a plurality of insulating films laminated above the semiconductor substrate;
  a first temperature measurement wiring pattern formed on a first insulating film which is one of the plurality of the insulating films;
  a first detection electrode formed on an uppermost insulating film of the plurality of the insulating films to be arranged at a position corresponding to the first temperature measurement wiring pattern;
  one or more first via electrode formed in one or more insulating films between the first temperature measurement wiring pattern and the first detection electrode to couple between the first temperature measurement wiring pattern and the first detection electrode;

a second temperature measurement wiring pattern formed on a second insulating film which is different from the first insulating film;

a second detection electrode formed on the uppermost insulating film to be arranged at a position corresponding to the second temperature measurement wiring pattern; and at least one second via electrode formed in an associated insulating films to couple between the second temperature measurement wiring pattern and the second detection electrode, wherein the first detection electrode is provided for contact with a first temperature measurement needle, wherein the temperature sensor circuit includes a bandgap reference circuit outputting an output voltage having temperature dependence and an analog-to-digital conversion circuit converting the output voltage of the bandgap reference circuit into a digital signal, wherein the first temperature measurement wiring pattern is arranged, in plan view, in a vicinity of the bandgap reference circuit, and wherein the first insulating film on which the first temperature measurement wiring pattern is formed is formed in a cross-sectional view under the second insulating film on which the second temperature measurement wiring pattern is formed.

2. The semiconductor device according to claim 1, wherein the first temperature measurement wiring pattern is arranged, in plane view, in a surrounding area of the temperature sensor circuit.

3. The semiconductor device according to claim 1, wherein the first temperature measurement wiring pattern is arranged, in plane view, on an area where the temperature sensor circuit is formed.

4. The semiconductor device according to claim 1, wherein the first temperature measurement wiring pattern is electrically insulated from a plurality of function circuits which are formed in the semiconductor device.

5. A method of trimming of a semiconductor device having a temperature sensor circuit for measuring a temperature of the semiconductor device, the semiconductor device including a semiconductor substrate on which the temperature sensor circuit is formed, a plurality of insulating films laminated above the semiconductor substrate, a first temperature measurement wiring pattern formed on a first insulating film which is one of the insulating films, a first detection electrode formed on an uppermost insulating film of the plurality of the insulating films to be arranged at a position corresponding to the first temperature measurement wiring pattern, and at least one first via electrode formed in an associated insulating films to couple between the first temperature measurement wiring pattern and the first detection electrode, the method comprising:

contacting the first detection electrode with a first temperature measurement needle;

supplying power to the semiconductor device;

measuring a first temperature in a vicinity of the temperature sensor circuit by measuring a temperature of the first temperature measurement wiring pattern with the first temperature measurement needle through the first detection electrode;

acquiring a code based on a voltage output having temperature dependence from the temperature sensor circuit after activating the temperature sensor circuit; and trimming a code to be output as an indication of a temperature of the semiconductor device, based on the first temperature and the code based on the voltage output having temperature dependence from the temperature sensor circuit.

6. The method according to claim 5, further comprising:

measuring a second temperature by measuring a temperature of the first temperature measurement wiring pattern with the first temperature measurement needle after the acquiring the code from the temperature sensor circuit; and trimming the code as the indication of the temperature of the semiconductor device based on the first temperature and the second temperature.

7. The method according to claim 5, wherein the semiconductor device further comprises:
  a second temperature measurement wiring pattern formed on a second insulating film which is different from the first insulating film;
  a second detection electrode formed on the uppermost insulating film to be arranged at a position corresponding to the second temperature measurement wiring pattern; and
  at least one second via electrode an associated insulating films to couple between the second temperature measurement wiring pattern and the second detection electrode, and wherein the method further comprises:
  contacting the second detection electrode with a second temperature measurement needle;
  measuring a second temperature in the vicinity of the temperature sensor circuit by measuring a temperature of the second temperature measurement wiring pattern with the second temperature measurement needle through the second detection electrode; and
  trimming the code to be output as the indication of the temperature of the semiconductor device based on the first temperature and the second temperature.

8. The method according to claim 7, wherein the first temperature measurement needle and the second temperature measurement needle have a heat absorption block.

* * * * *